United States Patent [19]

Mayfield

[11] 3,971,979

[45] July 27, 1976

[54] CURRENT/VOLTAGE TRANSDUCER

[75] Inventor: Glenn A. Mayfield, Columbus, Ohio

[73] Assignee: Esterline Corporation, New York, N.Y.

[22] Filed: Oct. 10, 1974

[21] Appl. No.: 513,530

[52] U.S. Cl. .................................. 323/1; 321/10; 323/16
[51] Int. Cl.² ......................................... G05F 3/08
[58] Field of Search ............... 323/1, 4, 16, 19; 330/22, 40; 321/9 R, 10

[56] References Cited
UNITED STATES PATENTS

| | | | |
|---|---|---|---|
| 3,588,672 | 6/1971 | Wilson | 323/4 |
| 3,626,313 | 12/1971 | Zuk | 330/40 |
| 3,679,963 | 7/1972 | Free et al. | 323/4 |
| 3,835,410 | 9/1974 | Wittlinger | 323/4 X |
| 3,840,819 | 10/1974 | Steckler | 330/22 X |
| 3,857,105 | 12/1974 | Avery | 330/40 X |

OTHER PUBLICATIONS

New Semiconductors, Electronics, vol. 42, Apr. 28, 1969, pp. 139–141.
Schlotzhauer et al., "An Improved Multioutput Current-Controlled Source", Proceedings of the IEEE, Aug. 1973, pp. 1154, 1155.

Primary Examiner—A. D. Pellinen
Attorney, Agent, or Firm—Frank H. Foster

[57] ABSTRACT

A circuit for providing an output direct current which is a linearly proportional analog of the average and the effective magnitude of a sinusoidal input voltage or current. A transformer couples the sinusoid to a rectifier which applies a rectified sinusoid to a filtered current mirror circuit of low power requirements in order to provide a ripple free, high impedance current source output. The current mirror circuit is imbalanced in order to provide a non-linear characteristic which compensates for the transformer-rectifier non-linearity. The current mirror circuit also has an RC feedback network with sufficient feedback and gain to obtain an active, low pass filter characteristic. Component values are selected to give a sharp cutoff, active filter just below the ripple frequency to give efficient ripple elimination yet permit a rapid response time. Matched, parallel connected semiconductor devices in the current mirror circuit permit circuit balance with the current in one branch being an integral multiple of current in the other branch.

9 Claims, 4 Drawing Figures

FIG 1
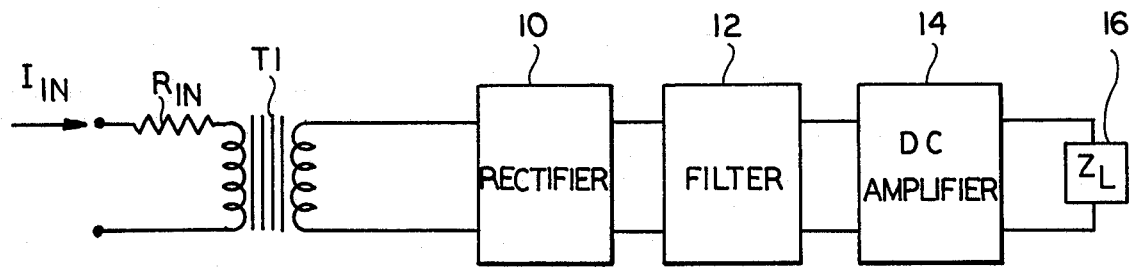
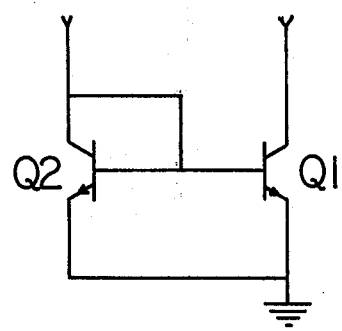
FIG. 2A
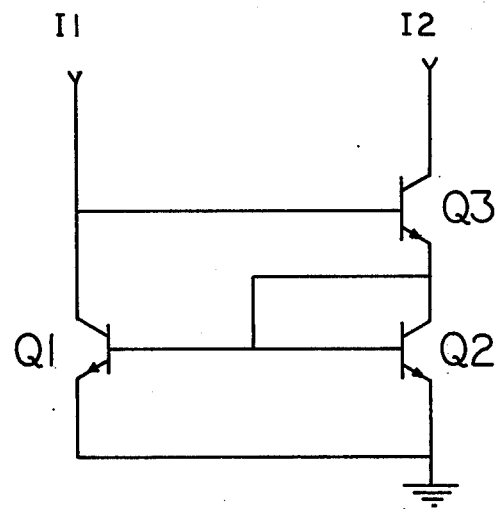
FIG. 2B
PRIOR ART CURRENT MIRRORS

CURRENT/VOLTAGE TRANSDUCER

BACKGROUND OF THE INVENTION

The present invention relates generally to electrical power instrumentation and more particularly relates to a current and voltage transducer circuit for providing a current source output having an output direct current which is directly proportional to the average and the effective value of a sinusoidal input voltage or current.

Current and voltage transducers are commonly utilized for monitoring and recording currents and voltages at various locations in a power distribution network and are also useful for providing analog input data for use by a power control system. Power systems utilizing such transducers may typically operate at 25 Hz, 50 Hz, 60 Hz, 400 Hz and even up to 1000 Hz.

Various operating characteristics are recognized as being desirable in such transducers. A highly linear transfer function is desired so that the output current accurately represents the magnitude of the sinusoid over a broad range of input magnitudes. It is also desirable that the output current be a smooth direct current. However, although ripple minimization is desired, a fast response time is also desired in order that there be little time delay from changes of the input sinusoid to corresponding output changes. It is also desirable that such transducers operate as current sources and therefore a circuit is needed which has a high output impedance so that the impedance of the load being driven by the transducer has no significant effect on the output current.

Traditionally, the need for a low ripple and a fast response have been met by an engineering trade off. Reducing ripple ordinarily produces a slower response time while a faster response time ordinarily was accompanied by increased ripple. There is therefore a need for a circuit which can provide decreased ripple with a faster response time.

Non-linearities of transducer circuits have been recognized as arising primarily from the non-linear characteristics of iron core transformers and the non-linear characteristics of the finite output impedance of the transformers working into the P-N junctions of the semiconductor devices in the circuit. In the past, these non-linearities have been overcome by using large transformers which provide large voltages and currents so that the relative effect of the non-linear circuit elements upon the circuit operation becomes insignificant compared to the effect of the linear circuit elements such as resistances and capacitances. Thus, in the past, linearity was sought by an attempt to make the gain and transfer function of the circuits determined, to a reasonable approximation, by the values of the linear circuit elements.

However, the use of large transformers and the operation of circuits with relatively large voltages and currents increases circuit cost, heat dissipation, power consumption as well as producing highly non-linear operation near the low magnitude boundary of the operational range of the transducer.

SUMMARY OF THE INVENTION

The invention is a sinusoid magnitude transducer of the type including a coupling means connected at its input to an electrical circuit and a rectifier means connected to the output of the coupling means for providing a rectified sinusoid corresponding to the magnitude of a voltage or current sinusoid in the electrical circuit. A current mirror circuit has its reference input branch connected to the output of the rectifier means and has an output load connected between the output branch of the current mirror circuit and the output of the rectifier means. The current mirror includes a first semiconductor junction sampling means for sampling the current in one of said branches and a second semiconductor means for controlling the current in the other branch. This circuit is improved in three ways, each alone improving its operation and together providing a very superior transducer.

One improvement results from providing as one of said semiconductor means a plurality of substantially matched, semiconductor devices connected in parallel each with a series emitter resistor having values as described. This permits the current mirror to be balanced with the current in one branch being an integral multiple of the current in the other branch.

Another improvement in operation results from selecting the emitter resistor values to operate the current mirror with a current imbalance which is offset from balance by an amount which is sufficient to provide a compensating nonlinear characteristic. With a plurality of parallel-connected, substantially identical, bipolar transistors and effective diodes connected in the output branch of the current mirror circuit, the circuit may be operated at an imbalance which is slightly offset from a balance condition in which the current in the output branch is slightly less than an integral multiple of the current in the input branch.

The circuit can be made to exhibit active filter characteristics by providing sufficient positive feedback and by connecting a first capacitor across the input reference branch of the current mirror and a second capacitor connected across components of the current mirror and resistively isolated from the first capacitance. Sufficient positive feedback is obtained by selecting the circuit elements, particularly the emitter resistors, so that the input leg current is not more than twice the output leg current.

It is therefore an object of the present invention to provide a current/voltage transducer of improved linearity over its entire range of operation.

Another object of the invention is to provide a current/voltage transducer having very substantially reduced power requirements and greater efficiencies.

Still another object of the invention is to provide both reduced ripple and a faster response time.

Further objects and features of the invention will be apparent from the following specification and claims when considered in connection with the accompanying drawings illustrating the preferred embodiments of the invention.

DESCRIPTION OF THE DRAWINGS

FIG. 1 is a block diagram of a current/voltage transducer.

FIG. 2A is a schematic diagram of a basic current mirror circuit as shown in the prior art.

FIG. 2B is a schematic diagram of a basic current mirror circuit as previously published in a non-analogous area of the prior art.

Figure 3:
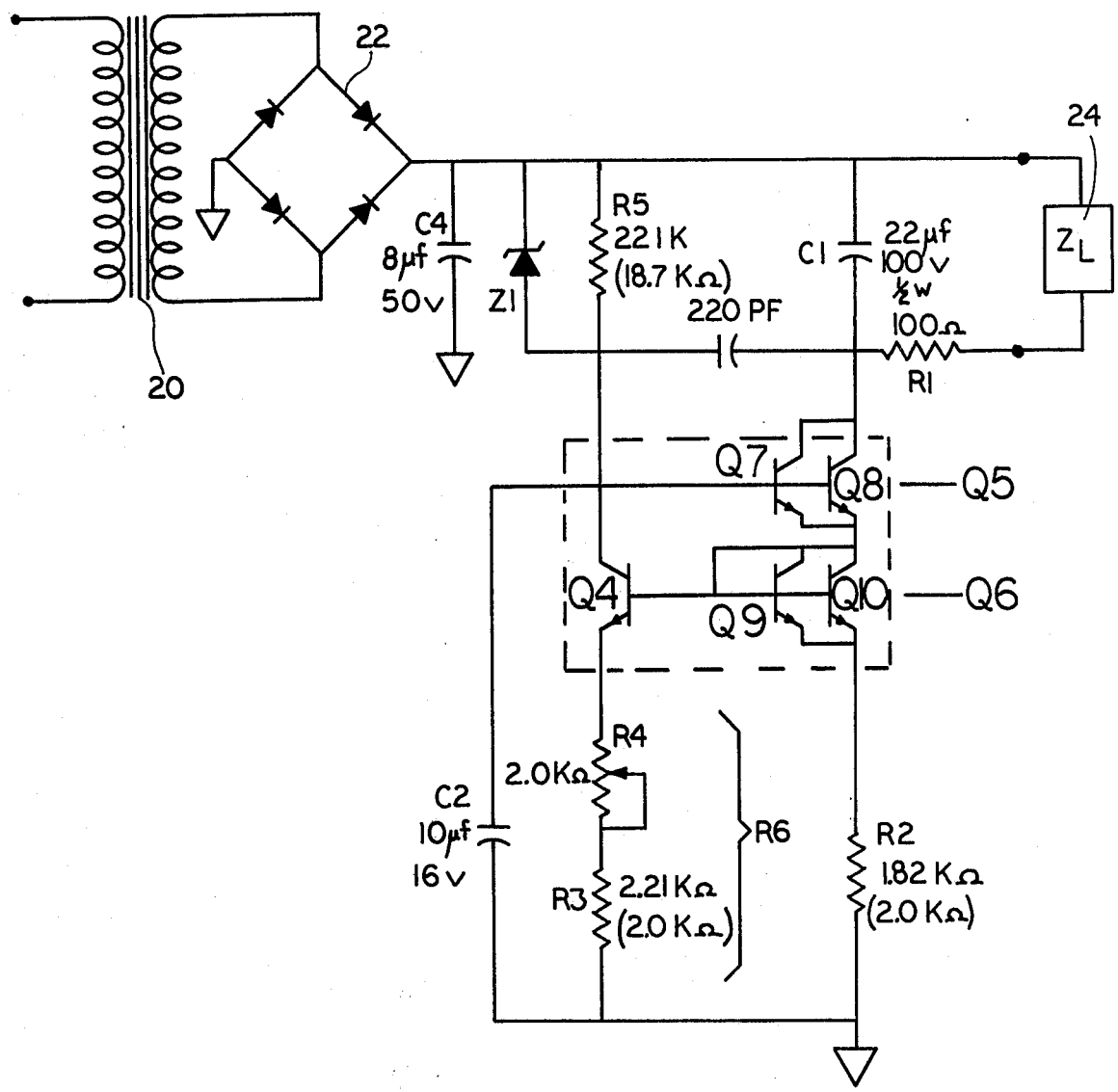
FIG. 3 is a schematic diagram of a current transducer circuit embodying the present invention.

In describing the preferred embodiments of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose. For example, the term "connection" is not limited to direct connection but includes connection through other circuit elements where such connection is recognized as being equivalent by those skilled in the art. Additionally, it should also be recognized that where a circuit element is referred to in the singular such elements may effectively be made up of a multiplicity of circuit elements which according to the tradition of those skilled in the art, may be simplified to a single effective element. Additionally, the order of connection of series connected elements can often be interchanged while retaining equivalent operation.

DETAILED DESCRIPTION

FIG. 1 illustrates a typical current/voltage transducer. It has a transformer T1 forming a coupling means with its primary winding connected to the electrical circuit to be measured. As has long been well known in the art, for measuring voltages it is common to utilize a large impedance RIN in series with the primary of transformer T1 and to use a transformer with a primary winding of many turns so that the circuit presents a high input impedance to the electrical circuit being monitored. However, for measuring currents, it has similarly been known in the art that the series impedance is desirably as small as possible so that RIN would be zero ohms and the primary of transformer T1 has few turns in order to present a minimum input impedance to the electrical circuit being monitored.

A rectifier circuit 10 is connected to the output of the transformer T1 for providing a rectified sinusoid having an average value corresponding to the magnitude of the voltage or current sinusoid $I_{IN}$ or $V_{IN}$ of the primary of the transformer T1.

Typically, the rectified sinusoid is filtered by a conventional two stage RC passive filter 12 to reduce ripple. The output of the filter 12 is then applied to a dc amplifier 14 having a high output impedance so that it substantially approximates a current source.

The output of the amplifier 14 drives an output load with a direct current which ideally is directly proportional to the magnitude of the voltage or current sinusoid at the primary of the transformer T1. This output load 16 might, for example, be a read out system, a recording device such as a strip chart or the input impedance of a control circuit.

Referring briefly to FIG. 3, a transformer 20 and a full wave bridge rectifier 22 are used in the preferred embodiment of the invention and correspond to the transformer T1 and rectifier 10 of FIG. 1. These apply a rectified sinusoid to a current mirror circuit embodying the present invention which in turn drives a load 24 corresponding to the load 16 of FIG. 1. Prior to discussion of applicant's circuit, some discussion of the current mirror circuit would be useful.

FIG. 2A illustrates the basic current mirror circuit which has a transistor Q1 forming an output branch of the current mirror circuit. It is connected as illustrated to a diode-connected transistor Q2 forming the input branch of the current mirror. If a current is forced through the input branch and transistor Q2, the base to emitter voltage of Q2 will rise until equilibrium is reached. The total current being supplied will be divided between the collector and the base region of Q2.

Thus, a base to emitter voltage is established in Q2 such that Q2 sinks the applied input current. If the base of the transistor Q1 is connected to the base of transistor Q2, and if both transistors have substantially identical characteristics, then Q1 will sink a current approximately equal to that flowing in the collector lead of the transistor Q2. The characteristics will be nearly identical if these transistors are fabricated by conventional integrated circuit techniques or if discrete devices are matched by selecting those with nearly identical characteristics. Thus, with the base-emitter voltages of Q1 and Q2 substantially identical, the base currents will be substantially identical and therefore the collector currents will be substantially identical.

This approximation will be closely approached for large values of $\beta$, the forward current transfer ratio for the common emitter configuration. Thus, for transistors of large $\beta$, the current of the output branch will mirror, that is, will be substantially equal to the current in the input branch.

The current mirror characteristic of the circuit of FIG. 2A may be improved by adding a transistor Q3 as illustrated in FIG. 2B and by reversing the role of the two branches. Thus, the branch of transistor Q1 has become the input reference branch while the branch of series transistors Q2 and Q3 has become the output branch. For this circuit it might be observed that the base-emitter junctions of transistors Q1 and Q2 have identical voltages applied to them. In this configuration, the diode connected transistor Q2 may be considered as a current sampling diode that senses the emitter current of transistor Q3 and adjusts the base current of transistor Q3 by way of transistor Q1 in order to maintain a constant current I2 in the output branch of the current mirror which is substantially equal to the input current I1 in the input branch. The operation of such current mirror circuits is discussed in RCA application note ICAN-6668.

Therefore the components of a current mirror of either generalized configuration are a current sampling pn junction which samples current in one branch, a feedback transistor responding to the sampled current for controlling the current in the other branch, and a transistor for controlling the current in the first branch in which the sampling junction is located.

For a circuit like that in FIG. 2A the pn junction of a transistor serves to sample the current while the entire device controls it — thus uniting two of the components which are characteristic of the current mirror. However, the current sampling pn junction can be a diode as well as a diode connected transistor.

In circuits embodying the present invention it is highly desirable to interpose emitter resistors in each branch of the current mirror, connected between the emitters and ground in the circuits shown. The term emitter resistor is used to denote a resistor connected in this manner, even if the current sampling junction is a diode because of the effective equivalency of such connections. This term also applies where the series connected transistor and resistor can be interchanged. It should also be noted that additional transistors can be stacked upon a FIG. 2B type current mirror according to the same principles by which an additional transistor was added to the circuit of FIG. 2A and the branches reversed in order to derive the circuit of FIG. 2B. Such stacking is of limited and diminishing benefit and still retains the characteristics of a current mirror circuit.

Referring again to FIG. 3, it can now be seen that the present invention has a current mirror circuit having its reference input branch connected to the output of the rectifier means and having the output load 24 connected between the output branch of the current mirror circuit and the output of the rectifier means. The reference input branch comprises an input, bipolar transistor Q4 in a common emitter configuration with a collector resistor R5 and a first emitter resistor R6. For calibration purposes emitter resistor R6 consists of a fixed resistor R3 and an adjustable resistance R4. Alternatively, resistor R2 may, in a similar manner be made variable or equivalently a potentiometer can be connected between the emitter resistors of the two legs for calibration.

The output branch of the current mirror circuit effectively comprises an output bipolar transistor Q5 in a common emitter configuration, having an effective diode Q6 connected to its emitter in a polarity to permit emitter current flow and having a second emitter resistor R2 connected to the opposite side of the diode. Thus, transistor Q5 corresponds to transistor Q3 of FIG. 2B and comprises a pair of parallel-connected, substantially identical, bipolar transistors Q7 and Q8. Similarly, the effective diode Q6 comprises a pair of parallel, diode connected transistors Q9 and Q10. All of these transistors are fabricated in a single integrated circuit.

The base of input transistor Q4 is connected intermediate the effective diode Q6 and the emitter of the output transistor Q5. The base of the output transistor Q5 is connected to the collector of the input transistor Q4.

It might be preliminarily observed that the resistance of the emitter resistor R6 is approximately twice the resistance of the emitter resistor R2. This relationship coupled with the use of parallel connected pairs of bipolar transistors as Q5 and Q6 in the output branch of a current mirror, permits the current mirror to be balanced in a state in which the current in the output branch is maintained at twice the current in the input branch. The present invention therefore contemplates the use of a plurality of matched, parallel connected transistors (not necessarily limited to two) in the output branch of a current mirror circuit in order to provide a current mirror circuit which may be balanced with a current in the output branch equal to an integral multiple of the current in the input branch. For example, by providing third parallel transistors, the output branch current would be three times the input branch circuit for a balanced condition.

In order to get current mirror balance condition with the current in one branch exceeding the current in the other by an integral relationship, it is only necessary to utilize a multiple parallel device either for the current sampling pn junction or the current controlling transistor in the other branch. For example in FIG. 3, in order to have current in the output branch twice as great as current in the input branch it is only required to double up transistor Q6. Transistor Q5 could be a single transistor.

In order to obtain an active, low pass, filter characteristic, a first capacitor C4 is shunted across the reference input branch of the current mirror and a second capacitor C2 is shunted across the series input transistor Q4 and emitter resistor R6. The values of these capacitors are chosen according to the criteria described below in connection with the operation of the preferred embodiment of the invention. It is believed that in order for significant active filter operation to occur, the current in the output branch of the current mirror must equal or exceed the current in the input branch. Therefore, the resistance of the emitter resistor R2 is preferably not greater than the resistance of the emitter resistor R6. However, some active filter benefits are to be expected even where the input branch current exceeds the output branch current.

Other circuit elements connected in the circuit are utilized for conventional purposes and therefore do not form a part of the present invention. For example, the zener diode Z1 is for transient suppression and resistance R1 together with capacitor C1 form a conventional low pass RC filter for transient protection. A capacitor between Z1 and R1 provides negative feedback at high frequencies for providing high frequency stability.

The operation of the circuit illustrated in FIG. 3 may now be considered. Because the transistors Q5 and Q6 in the output branch of the current mirror circuit each consist of a matched pair of parallel connected transistors, the current mirror circuit can be balanced by making the emitter resistor R6 twice the resistance of the emitter resistor R2. Consequently, with the current in the output branch equal to twice the current in the input branch, the current will be balanced with transistors Q4, Q9 and Q10 all operating at substantially identical points on their logarithmically-shaped characteristic curves.

If the current mirror is operated in this balanced condition, then the transistor non-linearities will cancel each other and the circuit will operate in a relatively linear manner. However, if the mirror circuit is unbalanced by making R6 slightly less than twice the resistance of R2, then the current mirror will exhibit some logarithmic non-linearity. Adjustment of the variable resistor R4 permits selection of the degree of nonlinearity desired. In the preferred embodiment of the invention the circuit is adjusted to compensate for combined or net nonlinearity for the transformer 20 in conjunction with the rectifier 22. In operation the circuit operates at the upper boundary of its range with approximately 1.0 ma in the output branch of the current mirror and 0.6 ma in its input branch.

As stated in the foregoing paragraph a circuit having two parallel connected diodes $Q_9$ and $Q_{10}$ is unbalanced by making $R_6$, the emitter resistor in the branch without parallel elements, slightly less than twice the resistance of $R_2$, the resistor in the branch with the two parallel diodes. This relationship may be generalized to the case of more than two parallel diodes by stating that the resistance of the emitter resistor connected to the branch with no parallel connected elements is less than the resistance of the emitter resistor in the branch with the multiple parallel connected diodes multiplied by the number of parallel connected diodes.

One of the advantages of this circuit is that integrated circuit technology has enabled manufactures to manufacture transistors on a single chip with consistently predictable characteristics. This enables a circuit designer to take the concept of the present invention and a suitable integrated circuit and arrive at the final specific component values empirically by experimentation. Consistently identical c/v transducer circuits can then be produced with only minor adjustment needed in resistance R4. Thus, one advantage of the present invention is that it can compensate for the non-linearity of the transformer in a consistently predictable manner.

Another advantage of the present invention is that it requires substantially less power than required by previous circuits. For example, it is common in the prior art to have a circuit drawing eight to ten milliamps and operating at 25 to 30 volts. Consequently, such a circuit requires approximately 200 to 300 milliwatts of power. However, the circuit of the present invention has been found to operate very well while drawing 1.6 milliamps at 13 volts. It consequently requires approximately 21 milliwatts of power.

This order of magnitude reduction in power requirements permits the use of a smaller and considerably less expensive transformer. However, another advantageous feature of the present invention is that its lower power requirement permits a transformer to be used having a greater number of secondary turns and consequently having a considerably higher inductive impedance.

The advantages of the increased inductive impedance in the transformer become apparent when considering the cause of non-linear operation of current/voltage transducers near the low magnitude boundary of its operational range.

In order for any solid state circuit to begin operation its base to emitter voltage must exceed the junction threshhold voltage which is typically 0.6 volts. Consequently, it is desirable that the threshhold voltages of the semiconductor devices in the circuit be reached at the least possible magnitude of the sinusoidal input.

To explain how this advantage is accomplished by the present invention, the transformer may be simplified to a current source having its inductive impedance shunted across it. The remainder of the circuit, which includes the semiconductor devices, may be considered to be a second impedance also shunted across the current source. Therefore, it becomes clear that the circuit may be simplified to a current divider. Because applicant's circuit permits the use of a transformer having a substantially higher effective inductive impedance, a substantially greater proportion of the current from the current source is directed through the circuit branch of the current divider. Consequently, the threshhold voltages of the semiconductor devices are reached at lower current levels which correspond to lower input sinuosid magnitudes.

In prior art current/voltage transducers, ripple is ordinarily filtered by shunting a capacitor across the output of the rectifier in the position of capacitor C4 in FIG. 3. This forms an ordinary RC passive filter. As is well known, the larger the capacitance the longer the response time of this circuit. Thus, compromising tradeoffs are required. The frequency response of an RC filter does not exhibit the sharp corner which can be obtained from LC filters and active filters.

A further advantage of the present invention is that through the careful selection of the capacitance of capacitors C2 and C4 and the provision for sufficient positive feedback, the circuit of the invention may be made to simultaneously exhibit an active filter characteristic. These capacitances are selected so that the circuit will operate as a low pass filter with a relatively sharp corner which is characteristic of an active filter in order to achieve a high degree of attentuation at the ripple frequency and above and yet permit a fast response.

Although the Figures illustrate the preferred connection of capacitor C2, a capacitor can be connected at other places in the mirror circuit. For example, resistor R5 could comprise two series resistors with capacitor C2 connected between them instead of the collector of Q4. Alternatively, it could be connected to the base of transistor Q5 with a resistor interposed between it and the collector of transistor Q4. As another alternative an equivalent capacitor could be shunted across resistor R6.

Therefore, to obtain beneficial active filtering characteristics capacitor C2 should be resistively separated or isolated from capacitor C4 and that it operate to effectively filter the output branch signal.

Active filter operation is possible in part because the circuit has active elements and significant feedback. The feedback current from the current mirror output branch to the current mirror input branch is a substantial portion of the total current in the input branch of the current mirror. This is of course, enhanced by the fact that the current in the output branch is approximately twice the current in the input branch.

In order to obtain sufficient positive feedback in the current mirror circuit, the output branch current must be significant relative to the input branch current. If for example, the reference input branch current were greater than the output branch current by a factor of 8 or 10, then feedback is negligible and active filter characteristics are not observed.

In the preferred circuit described, the ratio of input reference branch current to output branch current is 0.6. For purposes of obtaining sufficient positive feedback to attain an active filter characteristic according to the present invention, the ratio should be greater than 0 and less than 2.

If this ratio is in the range greater than 1 and less than 2, some improvement in circuit operation is achieved, with greater improvement for a smaller ratio. If the ratio is in the range greater than 0 and less than 1, very good improvement is observed. If the ratio is greater than approximately 2, the improvement is not significant.

The current ratio is controlled chiefly by the emitter resistor resistances and the semiconductor junctions connected thereto. The current ratio is therefore substantially determined by the total effective impedance of the current sampling junction and any emitter resistor connected thereto relative to the total effective impedance of the junction of the transistor controlling the other branch and any emitter resistor connected thereto.

The capacitance of capacitors C2 and C4 are chosen to satisfy two criteria: (1) that a desired response time be achieved with efficient ripple attenuation and (2) that a relatively sharp Butterworth low pass filter characteristic be obtained.

The circuit response time is primarily dependent upon the time constant associated with capacitor C4. This time constant is primarily determinative of the exponential time delay characteristic of the entire circuit. Thus, in one such time constant interval the output of the circuit will have made 63% of its eventual change due to an input change. Similarly, in approximately 4.6 time constant intervals the output will have reached 99% of its eventual change.

The time constant associated with capacitor C4 is chosen in order to position the corner of the filter characteristic below the ripple frequency but above the desired response "frequency". Preferably, it is at least approximately five times the period of the lowest ripple frequency but less than one fifth the desired response time for 99% response.

The period of the lowest ripple frequency will be 8.3 msec. (using a balanced full wave rectifier at 60 Hz). If a response time design criteria is chosen so that the circuit output reaches 99% of its eventual value in 400 msec., then the above criteria are satisfied if the time constant associated with C4 is approximately 90 msec.

In the preferred embodiment of the invention illustrated in FIG. 3, the total circuit resistance in shunt with capacitor C4 is seen to be approximately 9 K ohms, which would require that the capacitance of C4 be 8 or 9 $\mu$f. Capacitor C4 was chosen to be 8 $\mu$f.

In order to give a Butterworth characteristic, the capacitance of capacitor C2 is then chosen so that the time constant associated with it is approximately one half the time constant associated with capacitor C4.

The total resistance effectively shunted across capacitor C2 is approximately 3.6 K ohms. Therefore, since the time constant of approximately 72 msec. is associated with capacitor C4, the capacitance of C2 should be approximately 10 $\mu$f.

Active filter circuit design requires that the time constants associated with C2 and C4 not be exactly related by a 1:2 ratio because the output and input currents are not in 1:1 correspondence. Therefore the capacitance of capacitors C2 and C4 like the resistance of R4 may be determined experimentally in order to optimize circuit operation.

Although FIG. 3 primarily illustrates a current transducer, a voltage transducer circuit is essentially the same. There is illustrated in FIG. 3, in parentheses those alternative circuit values of R2, R3 and R5 which may be substituted in order to use the preferred embodiment as a voltage transducer. In addition to the illustrated substituted values, a transformer with a high impedance primary of many more turns is utilized along with a 7 K ohm resistor in series with the primary.

It is to be understood that while the detailed drawings and specific examples given describe preferred embodiments of the invention, they are for purposes of illustration only that the apparatus of the invention is not limited to the precise details and conditions disclosed and that various changes may be made therein without departing from the spirit of the invention which is defined by the following claims.

What is claimed is:

1. In a magnitude transducer for driving an output load with a direct current which is directly proportional to the magnitude of a voltage or current sinusoid at a selected part of an electrical circuit, said transducer being of the type including a coupling means connected at its input to said electrical circuit, a rectifier means connected to the output of said coupling means for providing a rectified sinusoid corresponding to the magnitude of said voltage or current sinusoid, and a current mirror circuit having a reference input branch connected to the output of said rectifier means and having said output load connected between the output branch of said current mirror circuit and the output of said rectifier means, said current mirror circuit including a first semiconductor junction sampling means for sampling the current in one of said branches and a second semiconductor means for controlling the current in the other branch, wherein the improvement comprises: an emitter resistor connected in each of said branches, the resistance of said emitter resistors being offset from being integrally proportional so as to provide a current imbalance in said current mirror by an amount sufficient to provide a non-linear characteristic in said current mirror for compensating other non-linearities of said transducer to provide improved transducer linearity.

2. A transducer according to claim 1 wherein said reference input branch comprises an input bipolar transistor in a common emitter configuration with a collector resistor and a first emitter resistor series connected thereto; wherein said output branch comprises an output bipolar transistor in a common emitter configuration and having an effective diode connected to its emitter in a polarity to permit emitter current flow and having a second emitter resistor connected to the opposite side of said diode wherein the base of said input transistor is connected intermediate said effective diode and the emitter of said output transistor and the base of said output transistor is connected to the collector of said input transistor and wherein said effective diode comprises a number of substantially matched parallel connected effective diodes, and wherein the resistance of said first emitter resistor is less than the product of the number of parallel connected effective diodes times the resistance of said second emitter resistor by an offsetting amount sufficient to provide said compensating non-linear characteristic in said current mirror.

3. In a magnitude transducer for driving an output load with a direct current which is directly proportional to the magnitude of a voltage or current sinusoid at a selected part of an electrical circuit, said transducer being of the type including a coupling means connected at its input to said electrical circuit, a rectifier means connected to the output of said coupling means for providing a rectifier sinusoid corresponding to the magnitude of said voltage or current sinusoid, and a current mirror circuit having a reference input branch connected to the output of said rectifier means, said current mirror circuit including a first semiconductor junction sampling means for sampling the current in one of said branches and a second semiconductor means for controlling the current in the other branch wherein the improvement comprises: a first capacitor shunted across the entire reference input branch of said current mirror and a second capacitor connected across components of said current mirror and resistively isolated from said first capacitance for filtering the signal of said output branch, and wherein the current in said input reference branch is no greater than twice the current in said output branch.

4. A transducer according to claim 3 wherein said reference input branch comprises an input bipolar transistor in a common emitter configuration with a collector resistor and a first emitter resistor series connected thereto; wherein said output branch comprises an output bipolar transistor in a common emitter configuration and having an effective diode connected to its emitter in a polarity to permit emitter current flow and having a second emitter resistor connected to the opposite side of said diode; wherein the base of said input transistor is connected intermediate said effective diode and the emitter of said output transistor and the base of said output transistor in connected to the collector of said input transistor and wherein said second capacitor is shunted across the series input transistor and first emitter resistor.

5. A transducer according to claim 4 wherein the product of the capacitance of said first capacitor and the total resistance effectively shunted thereto is approximately twice the product of the capacitance of said second capacitor and the total resistance effectively shunted thereto.

6. A transducer according to claim 5 wherein the greater of said products is approximately in the range between five times the ripple period and one fifth the desired 99% filter response time.

7. A transducer according to claim 3 wherein an emitter resistor is connected in each of said branches, the resistance of said emitter resistors being offset from being integrally proportional so as to provide a current imbalance in said current mirror by an amount sufficient to provide a compensating non-linear characteristic in said current mirror to provide improved transducer linearity.

8. A transducer according to claim 3 wherein a plurality of substantially matched, semiconductor devices are connected in parallel to form one of said semiconductor means and an emitter resistor is connected in each branch of said current mirror, the resistor in the branch having said parallel connected devices being offset from the resistance of the resistor in the other branch divided by the number of said devices connected in parallel to each other to produce a current imbalance in said current mirror which is sufficient to provide a compensating non-linear characteristic in said current mirror to provide improved transducer linearity.

9. A transducer according to claim 8 wherein said reference input branch comprises an input bipolar transistor in a common emitter configuration with a collector resistor and a first emitter resistor series connected thereto; wherein said output branch comprises an output bipolar transistor in a common emitter configuration and having an effective diode connected to its emitter in a polarity to permit emitter current flow and having a second emitter resistor connected to the opposite side of said diode wherein the base of said input transistor is connected intermediate said effective diode and the emitter of said output transistor and the base of said output transistor is connected to the collector of said input transistor and wherein said effective diode comprises a number of substantially matched parallel connected effective diodes, and wherein the resistance of said first emitter resistor is less than the product of the number of parallel connected effective diodes and the resistance of said second emitter resistor by an offsetting amount sufficient to provide said compensating non-linear characteristic in said current mirror.

* * * * *